United States Patent
Zhu et al.

(10) Patent No.: US 11,381,377 B2
(45) Date of Patent: Jul. 5, 2022

(54) DATA SIGNAL DETECTION APPARATUS, AND MOBILE INDUSTRY PROCESSOR INTERFACE RADIO FREQUENCY FRONT-END SLAVE DEVICE AND SYSTEM

(71) Applicant: MAXSCEND MICROELECTRONICS COMPANY LIMITED, Jiangsu (CN)

(72) Inventors: Shining Zhu, Jiangsu (CN); Yibo Wang, Jiangsu (CN)

(73) Assignee: MAXSCEND MICROELECTRONICS COMPANY LIMITED

( * ) Notice: Subject to any disclaimer, the term of this patent is extended or adjusted under 35 U.S.C. 154(b) by 231 days.

(21) Appl. No.: 16/844,472

(22) PCT Filed: Aug. 8, 2019

(86) PCT No.: PCT/CN2019/099858
§ 371 (c)(1),
(2) Date: Apr. 9, 2020

(87) PCT Pub. No.: WO2019/238144
PCT Pub. Date: Dec. 19, 2019

(65) Prior Publication Data
US 2021/0367750 A1    Nov. 25, 2021

(30) Foreign Application Priority Data
Jun. 12, 2018  (CN) .......................... 201810603036.7

(51) Int. Cl.
*H04L 7/00* (2006.01)
*G11C 19/28* (2006.01)
*H03K 19/20* (2006.01)

(52) U.S. Cl.
CPC ............ *H04L 7/0079* (2013.01); *G11C 19/28* (2013.01); *H03K 19/20* (2013.01)

(58) Field of Classification Search
CPC ..... H04L 7/0079; H04L 7/0008; G11C 19/28; H03K 19/20; H03K 3/027; H03K 5/153
See application file for complete search history.

(56) References Cited

U.S. PATENT DOCUMENTS 10,462,268 B2 * 10/2019 Yanai ...................... H04L 7/041
2003/0081709 A1 * 5/2003 Ngo .......................... H04L 7/00
375/362

(Continued)

FOREIGN PATENT DOCUMENTS

| CN | 106933770 | 7/2017 |
| CN | 108718192 | 10/2018 |
| CN | 208369547 | 1/2019 |

OTHER PUBLICATIONS

Patent Cooperation Treaty (PCT), International Search Report and Written Opinion for Application PCT/CN2019/099858 filed on Aug. 8, 2019, dated Nov. 8, 2019, International Searching Authority, CN.

*Primary Examiner* — Jean B Corrielus
(74) *Attorney, Agent, or Firm* — McDonald Hopkins LLC

(57) ABSTRACT

Provided are a data signal detection device, and mobile industry processor interface radio frequency front-end device and system. The device includes: a first acquisition circuit, a second acquisition circuit and a selection output circuit. A first input terminal of the first acquisition circuit is connected to a second input terminal of the second acquisition circuit, and a second input terminal of the first acquisition circuit is connected to a first input terminal of the second acquisition circuit. Output terminals of the first acquisition circuit and the second acquisition circuit are connected to two input terminals of the selection output circuit. The acquisition circuit is configured to verify (Continued)

whether an acquisition signal meets a characteristic of a data signal; and the selection output circuit selects an acquisition signal from a received acquisition signal and a received invalid signal for output.

13 Claims, 5 Drawing Sheets

(56) References Cited

U.S. PATENT DOCUMENTS

| | | | |
|---|---|---|---|
| 2012/0137037 A1* | 5/2012 | Xiong | G05B 19/0423 710/301 |
| 2013/0242800 A1 | 9/2013 | Gruber et al. | |
| 2014/0304442 A1 | 10/2014 | Hietala et al. | |
| 2017/0255578 A1 | 9/2017 | Ngo et al. | |

* cited by examiner

SSC: Sequence Start Condition
SA: Slave address
D: Data

DATA SIGNAL DETECTION APPARATUS, AND MOBILE INDUSTRY PROCESSOR INTERFACE RADIO FREQUENCY FRONT-END SLAVE DEVICE AND SYSTEM

CROSS-REFERENCE TO RELATED APPLICATION

The present disclosure is a 35 U.S.C. 371 national stage filing of PCT Application No. PCT/CN2019/099858 filed on Aug. 8, 2019 which claims priority to a Chinese patent application No. 201810603036.7 filed on Jun. 12, 2018, disclosures of which are incorporated herein by reference in their entireties.

TECHNICAL FIELD

Embodiments of the present disclosure relate to computer hardware technologies, for example, to a data signal detection device, a mobile industry processor interface (MIPI) radio frequency front-end (RFFE) slave device, and an MIPI RFFE system.

BACKGROUND

With the continuous development of technologies, the demand for radio frequency front-end devices (such as power amplifiers, active antenna tuners, low-noise amplifiers, and antenna switches) is increasing, and it is a huge challenge for device manufacturers to take all radio frequency front-end devices into control. The mobile industry processor interface (MIPI) alliance develops standards for RF front-end (RFFE) devices and provides a set of bus interfaces for connecting multiple front-end devices, so that these RFFE devices can be controlled conveniently with the usage of radio frequency chips.

FIG. 1a shows a schematic diagram of a mobile industry processor interface radio frequency front-end (MIPI RFFE) system in the related art. As shown in FIG. 1a, the mobile industry processor interface radio frequency front-end standard defines an interface between RFFE devices. One master device may be mounted on a single RFFE bus, and up to 15 slave devices may be mounted at the same time (merely slave device 1 and slave device 2 are shown in FIG. 1a). The bus uses two signal lines, one is a clock signal line (SCLK) controlled by a host, and the other is a unidirectional/bidirectional data line (SDATA). Each RFFE slave device coupled to the RFFE bus may be identified through identity (ID) signals such as a unique slave ID (USID), a PRODUCT_ID (PID) or a MANUFACTURER_ID (MfrlID).

FIG. 1b shows waveform diagrams of signals transmitted on the SCLK and the SDATA in the related art. As shown in FIG. 1b, each frame of data on the SDATA starts with a Sequence Start Condition (SSC) signal, and at this time, no clock signal is transmitted on the SCLK. Next to the SSC signal, a command frame is transmitted. The first 4 bits of the command frame are SA signals used for matching identity information of the RFFE slave device. If a RFFE slave device matches the SA signals, the RFFE slave device learns that the above command frame is an operation initiated by the RFFE master device for the RFFE slave device itself.

However, when two slave devices have the same USID, PID, and MfrlID, the mobile industry processor interface radio frequency front-end master device cannot distinguish between the two slave devices. A solution is provided in the related art. As shown in FIG. 1c, when two mobile industry processor interface radio frequency front-end slave devices (slave device 1 and slave device 2) are the same, the SCLK of slave device 1 is connected to the SCLK of the master device and the SDATA of slave device 1 is connected to the SDATA of the master device; the SCLK of slave device 2 is connected to the SDATA of the master device and the SDATA of slave device 2 is connected to the SCLK of the master device. Each slave device detects whether the SCLK and SDATA of the each slave device itself are interchanged by detecting the SSC signal in received signals, so that the each slave device can reprogram its own identity characteristics information, thereby distinguishing between two same mobile industry processor interface radio frequency front-end slave devices in the mobile industry processor interface radio frequency front-end system.

In the process of implementing the related art, the inventor finds that the related art has the following defects: in the related art, the SSC is used for detecting whether the SCLK and the SDATA are interchanged, if the SSC signal is distorted due to a glitch or an unstable state when the bus is powered on, it is difficult to guarantee the accuracy of the SCLK and SDATA identification. Consideration of abnormal situations is inadequate, and identification accuracy is poor.

SUMMARY

Embodiments of the present disclosure provide a data signal detection device, a mobile industry processor interface radio frequency front-end slave device and a mobile industry processor interface radio frequency front-end system. The bus conflict problem of the same mobile industry processor interface radio frequency front-end slave devices in the mobile industry processor interface radio frequency front-end system is solved, and at the same time, the identification accuracy and reliability of the entire mobile industry processor interface radio frequency front-end system are improved.

In a first aspect, an embodiment of the present disclosure provides a data signal detection device, and the device includes: two acquisition circuits having a same circuit structure and a selection output circuit, where the two acquisition circuits are a first acquisition circuit and a second acquisition circuit.

A first input terminal of the first acquisition circuit is connected to a second input terminal of the second acquisition circuit, and a second input terminal of the first acquisition circuit is connected to a first input terminal of the second acquisition circuit; output terminals of the two acquisition circuits are respectively connected to two input terminals of the selection output circuit.

The first acquisition circuit is configured to: use a signal received by the first input terminal of the first acquisition circuit as a clock signal to acquire a signal received by the second input terminal of the first acquisition circuit; verify whether an acquisition signal acquired by the first acquisition circuit meets a characteristic of a data signal; based on a verification result that the acquisition signal acquired by the first acquisition circuit meets the characteristic of the data signal, output the acquisition signal acquired by the first acquisition circuit to the selection output circuit; and based on a verification result that the acquisition signal acquired by the first acquisition circuit does not meet the characteristic of the data signal, output a set invalid signal to the selection output circuit.

The second acquisition circuit is configured to: use a signal received by the first input terminal of the second acquisition circuit as a clock signal to acquire a signal received by the second input terminal of the second acquisition circuit; verify whether an acquisition signal acquired by the second acquisition circuit meets the characteristic of the data signal; based on a verification result that the acquisition signal acquired by the second acquisition circuit meets the characteristic of the data signal, output the acquisition signal acquired by the second acquisition circuit to the selection output circuit; and based on a verification result that the acquisition signal acquired by the second acquisition circuit does not meet the characteristic of the data signal, output the invalid signal to the selection output circuit.

The selection output circuit is configured to select, from the received acquisition signal and the received invalid signal, the received acquisition signal to output as the data signal.

In a second aspect, an embodiment of the present disclosure further provides a mobile industry processor interface radio frequency front-end slave device, and the slave device includes: the data signal detection device of any embodiment herein, a first device input terminal, a second device input terminal and a data signal processing unit.

The first device input terminal is connected to a first input terminal of a target acquisition circuit in the data signal detection device, and the target acquisition circuit is one of the two acquisition circuits in the data signal detection device; the second device input terminal is connected to a second input terminal of the target acquisition circuit; the data signal processing unit is connected to the selection output circuit in the data signal detection device.

One of the first device input terminal or the second device input terminal is configured to receive a clock signal, and the other one of the first device input terminal or the second device input terminal is configured to receive a data signal.

The data signal detection device is configured to select a correct data signal among signals input from the first device input terminal and the second device input terminal and send the correct data signal to the data signal processing unit.

The data signal processing unit is configured to process the received data signal.

The data signal processing unit pre-stores a slave address that matches the mobile industry processor interface radio frequency front-end slave device.

In a third aspect, an embodiment of the present disclosure further provides a mobile industry processor interface radio frequency front-end system, and the system includes: a mobile industry processor interface radio frequency front-end master device and two mobile industry processor interface radio frequency front-end slave devices of any embodiment in the present disclosure; where the two mobile industry processor interface radio frequency front-end slave devices are the same, and the two slave devices are a first mobile industry processor interface radio frequency front-end slave device and a second mobile industry processor interface radio frequency front-end slave device.

A clock terminal of the mobile industry processor interface radio frequency front-end master device is separately connected to a first device input terminal of the first mobile industry processor interface radio frequency front-end slave device and a second device input terminal of the second mobile industry processor interface radio frequency front-end slave device; a data terminal of the mobile industry processor interface radio frequency front-end master device is separately connected to a second device input terminal of the first mobile industry processor interface radio frequency front-end slave device and a first device input terminal of the second mobile industry processor interface radio frequency front-end slave device; a file register of each mobile industry processor interface radio frequency front-end slave device pre-stores a different slave address.

DETAILED DESCRIPTION

Figure 1A:
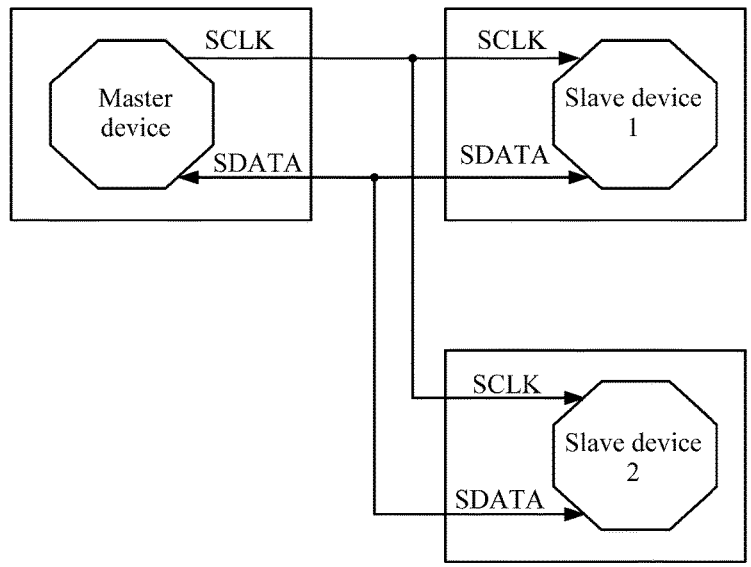
FIG. 1a is a schematic diagram of a mobile industry processor interface radio frequency front-end system in the related art.

Hereinafter the present disclosure will be further described in detail in conjunction with the drawings and embodiments. It may be understood that the specific embodiments set forth below are intended to illustrate and not to limit the present disclosure. Additionally, it is to be noted that, for convenience of description, only part, not all, of the structures related to the present disclosure are illustrated in the drawings.

Embodiment 1

Figure 2A:
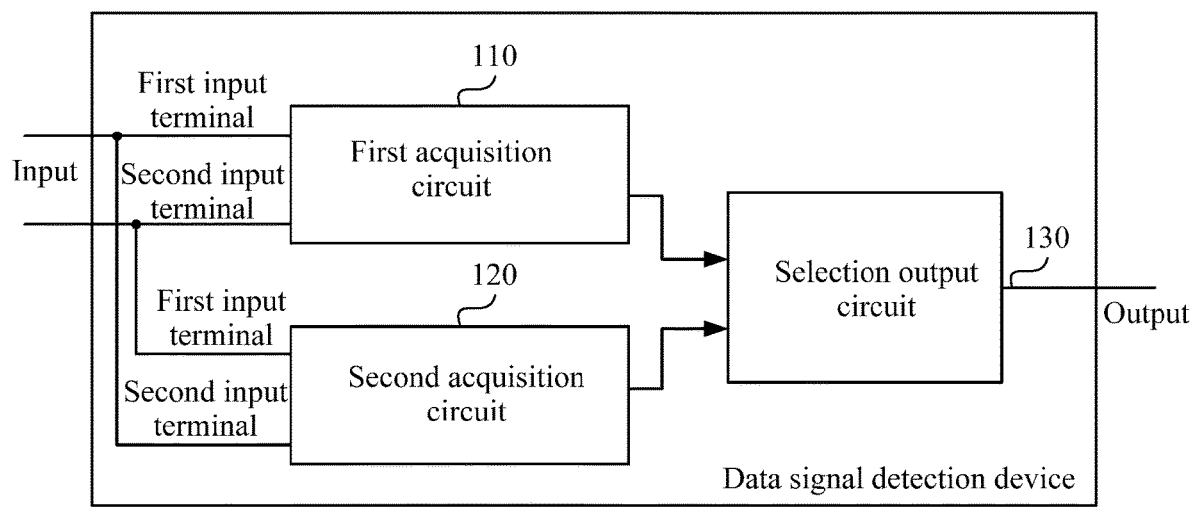
FIG. 2a is a structural diagram of a data signal detection device according to embodiment 1 of the present disclosure.

FIG. 2a is a structural diagram of a data signal detection device according to embodiment 1 of the present disclosure. As shown in FIG. 2a, the data signal detection device includes: two acquisition circuits (such as a first acquisition circuit 110 and a second acquisition circuit 120 in FIG. 2a) having a same circuit structure, and a selection output circuit 130.

A first input terminal of the first acquisition circuit 110 is connected to a second input terminal of the second acquisition circuit 120, and a second input terminal of the first acquisition circuit 110 is connected to a first input terminal of the second acquisition circuit 120; output terminals of the two acquisition circuits are respectively connected to two input terminals of the selection output circuit 130.

Each of the acquisition circuits (the first acquisition circuit 110 or the second acquisition circuit 120) is configured to: use a signal received by the first input terminal as a clock signal, acquire a signal received by the second input terminal, verify whether an acquisition signal meets a characteristic of a data signal, if the acquisition signal meets the characteristic of the data signal, output the acquisition signal, and if the acquisition signal does not meet the characteristic of the data signal, output a set invalid signal.

The selection output circuit 130 is configured to select, from the received acquisition signal and the received invalid signal, the acquisition signal to output as the data signal.

As shown in FIG. 2a, the data signal detection device has two input terminals and one output terminal. The two input terminals are respectively connected to the first terminal and the second terminal of the first acquisition circuit 110, and are respectively connected to the second input terminal and the first input terminal of the second acquisition circuit 120, and the output terminal of the data signal detection device is the output terminal of the selection output circuit 130.

The function of the data signal detection device is that when one of the two input signals is a clock signal and the other is a data signal, the selection output circuit can effectively output the data signal no matter which input terminals the clock signal and data signal are respectively input from. The implementation manner may be that the two acquisition circuits each use the signal received by the first data terminal as a clock to acquire the signal received by the second input terminal. It may be understood that merely one acquisition circuit can correctly acquire the data signal, and the other one cannot correctly acquire the data signal. Then, each acquisition circuit independently verifies whether the acquisition signal acquired by itself meets the characteristic of the data signal, for example: whether a specific data combination is included, whether a check result of the parity bit is accurate, or whether the acquisition signal meets the signal characteristic (for example, average power range) of the data signal. Similarly, merely one acquisition circuit can determine that the acquisition signal acquired by the one acquisition circuit meets the characteristic of the data signal and output the acquisition signal accordingly, and the other acquisition circuit determines that the acquisition signal acquired by the other acquisition circuit does not meet the characteristic of the data signal and outputs the set invalid signal accordingly. Correspondingly, as long as the selection output circuit 130 is configured to correctly distinguish the difference between the acquisition signal and the invalid signal when the acquisition signal and the invalid signal are received at the same time, the acquisition signal can be output as the data signal accordingly.

It may be understood that those skilled in the art may use various logic devices (such as NAND gates or comparators) to build the acquisition circuit according to the logic to be implemented by the acquisition circuit, or use programmable logic devices such as the field programmable gate array (FPGA) or the digital signal processor (DSP) to implement the above acquisition circuit.

In an optional implementation mode of the embodiment, the invalid signal includes signals which are all at low level; correspondingly, the selection output circuit may be an OR gate device, and the OR gate device is configured to output the acquisition signal when the inputs are the acquisition signal and the signals which are all at low level.

Figure 2B:
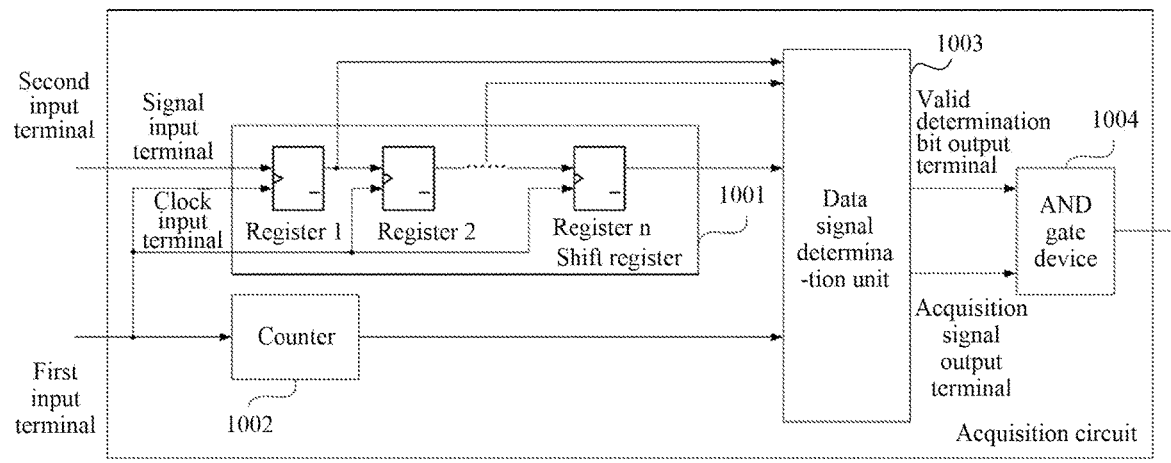
FIG. 2b is a schematic structural diagram of an acquisition circuit in a data signal detection device according to embodiment 1 of the present disclosure.

In an embodiment, for a data signal whose data type is a data frame having a set number of data bits, the embodiment of the present disclosure provides a schematic structural diagram of an acquisition circuit. FIG. 2b shows a schematic structural diagram of an acquisition circuit in the data signal detection device according to embodiment 1 of the present disclosure.

As shown in FIG. 2b, the acquisition circuit includes: a shift register 1001 which matches the number of data bits of the data frame, a counter 1002, a data signal determination unit 1003, and an AND gate device 1004.

A clock input terminal of the shift register 1001 is the first input terminal, a signal input terminal of the shift register is the second input terminal, an output terminal of each register (register 1, register 2, . . . , register n in FIG. 2b) of the shift register 1001 is separately connected to an input terminal of the data signal determination unit, an input terminal of the counter 1002 is connected to the clock input terminal of the shift register 1001, an output terminal of the counter 1002 is connected to an input terminal of the data signal determination unit 1003, an acquisition signal output terminal and a valid determination bit output terminal of the data signal determination unit 1003 are respectively connected to two input terminals of the AND gate device 1004, and an output terminal of the AND gate device 1004 is the output terminal of the acquisition circuit.

The shift register 1001 is configured to acquire an acquisition signal which matches the number of data bits of the data frame, and send the acquisition signal to the data signal determination unit 1003.

The counter 1002 is configured to send indication information to the data signal determination unit 1003 when the counter 1002 counts to the number of data bits of the data frame.

The data signal determination unit 1003 is configured to: in reception of the indication information, combine data stored in the respective registers of the shift register 1001 as an acquisition signal, output the acquisition signal to the acquisition signal output terminal, verify whether the acquisition signal meets the characteristic of the data signal, generate a valid determination bit corresponding to the verification result, and output the valid determination bit to the valid determination bit output terminal.

The AND gate device 1004 is configured to output a result obtained by performing the and operation on the valid determination bit and the acquisition signal.

In an embodiment, the working principle of the acquisition circuit is as follows: if the clock signal is correctly accessed to the first input terminal of the acquisition circuit and the data signal is correctly accessed to the second input terminal of the acquisition circuit, when the counter 1002 counts to the number of data bits (for example, 3 bits, 5 bits, etc.) of the data frame, pieces of data stored in respective registers in the shift register 1001 are respective data bits in the data frame. Correspondingly, when the data signal determination unit 1003 detects the indication information sent by the counter 1002, the data stored in respective registers in the shift register 1001 may be combined as the acquisition signal, and it may be further verified whether the acquisition signal meets the characteristic of the data signal to generate the valid determination bit accordingly. Typically, if the acquisition signal meets the characteristic of the data signal, a high-level signal may be output accordingly as the valid determination bit. If the acquisition signal does not meet the characteristic of the data signal, a low-level signal may be output accordingly as the valid determination bit of Correspondingly, the data signal determination unit 1003 can output the acquisition signal and the valid determination bit to the AND gate device 1004, such that the AND gate device 1004 outputs the data signal or signals which are all at low level.

It should be noted that in an embodiment, the number of valid determination bit(s) generated in the data signal determination unit 1003 may be one or more, the data signal determination unit 1003 may output single-channel acquisition signal or multi-channel acquisition signals (combination of multi-channel signals constitutes a completed data frame), and correspondingly, the number of the AND gate device(s) 1004 may also be one or more. Those skilled in the art may design the numbers of the above parameters and the combination manners according to the actual characteristic of the data signal. In the embodiment of the present disclosure, a data signal detection device is constructed by using two acquisition circuits having the same circuit structure and the selection output circuit. Two input terminals of one of the two acquisition circuits are cross-connected to two input terminals of the other one of the two acquisition circuits, so that it is possible to implement that when one of the two input signals input to the data signal detection device is a clock signal and the other one is a data signal, the two acquisition circuits each use the signal received by the first input terminal as a clock to acquire the signal received by the second input terminal, verify whether the acquisition signal meets the characteristic of the data signal and output the corresponding signal to the selection output circuit according to the verification result, which can achieve the effect that the selection output circuit can accurately output the data signal no matter how the two input signals input to the data signal detection device are connected to the above two acquisition circuits.

Based on the above embodiments, the acquisition circuit may further include: a locking circuit.

The locking circuit is separately connected to the valid determination bit output terminal of a present acquisition circuit and another acquisition circuit; the locking circuit is configured to lock the another acquisition circuit so that the another acquisition circuit no longer works when the valid determination bit output terminal of the present acquisition circuit outputs a valid signal.

Typically, the locking circuit may be implemented by at least one of a flip-flop or a latch. The advantage of this setting is that the signal generated when the clock signal and the data signal are reversely connected is prevented from interfering with the entire device and the anti-interference ability of the entire device is improved.

Embodiment 2

Figure 3A:
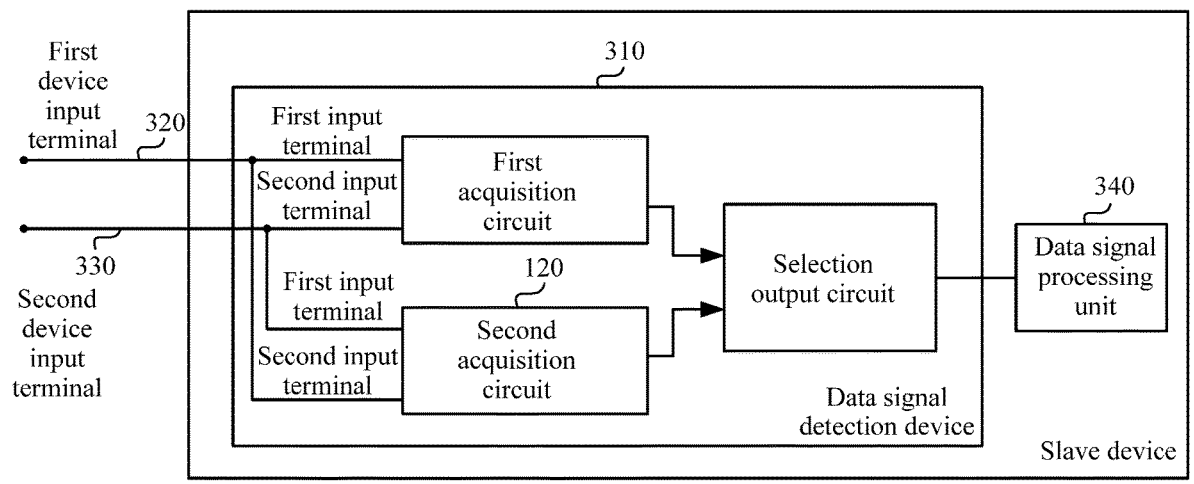
FIG. 3a is a schematic structural diagram of a mobile industry processor interface radio frequency front-end slave device according to embodiment 2 of the present disclosure.

FIG. 3*a* is a mobile industry processor interface radio frequency front-end slave device (that is, MIPI RFFE slave device) according to embodiment 2 of the present disclosure. As shown in FIG. 3*a*, the mobile industry processor interface radio frequency front-end slave device includes: the data signal detection device 310 described in any embodiment of the present disclosure, a first device input terminal 320, a second device input terminal 330 and a data signal processing unit 340.

The first device input terminal 320 is connected to a first input terminal of a target acquisition circuit (such as the first acquisition circuit in FIG. 3*a*) in the data signal detection device 310, and the target acquisition circuit is one of the two acquisition circuits in the data signal detection device 310; the second device input terminal 330 is connected to a second input terminal of the target acquisition circuit; the data signal processing unit 340 is connected to the selection output circuit in the data signal detection device 310.

The first device input terminal 320 is configured to receive a clock signal or a data signal; the second device input terminal 330 is configured to receive the data signal or the clock signal.

The data signal detection device 310 is configured to select a correct data signal among signals input from the first device input terminal 320 and the second device input terminal 330 and send the correct data signal to the data signal processing unit 340.

The data signal processing unit 340 is configured to process the received data signal.

Typically, the first device input terminal 320 is generally an SCLK terminal in the mobile industry processor interface radio frequency front-end slave device, and the second device input 330 is generally an SDATA terminal in the mobile industry processor interface radio frequency front-end slave device.

In the embodiment, a specific structure of a mobile industry processor interface radio frequency front-end slave device is provided. The data signal detection device 310 described in any embodiment of the present disclosure is used in the mobile industry processor interface radio frequency front-end slave device, so that the problem of a bus conflict between two same mobile industry processor interface radio frequency front-end slave devices in the mobile industry processor interface radio frequency front-end system (i.e., MIPI RFFE system) can be effectively solved.

In some embodiments, the two acquisition circuits in the data signal detection device 310 of the mobile industry processor interface radio frequency front-end slave device may be configured with different slave addresses in advance, and the mobile industry processor interface radio frequency front-end master device (that is, the MIPI RFFE master device) is configured in advance to be able to distinguish between the two same mobile industry processor interface radio frequency front-end slave devices according to the above two slave addresses. Correspondingly, when two device input terminals of one of the two mobile industry processor interface radio frequency front-end slave devices and two device input terminals of the other one of the two mobile industry processor interface radio frequency front-end slave devices are cross-connected to the mobile industry processor interface radio frequency front-end master device, each mobile industry processor interface radio frequency front-end slave device uses the slave address that may eventually be matched as its own slave address, and the bus conflict can be effectively solved.

Figure 1B:
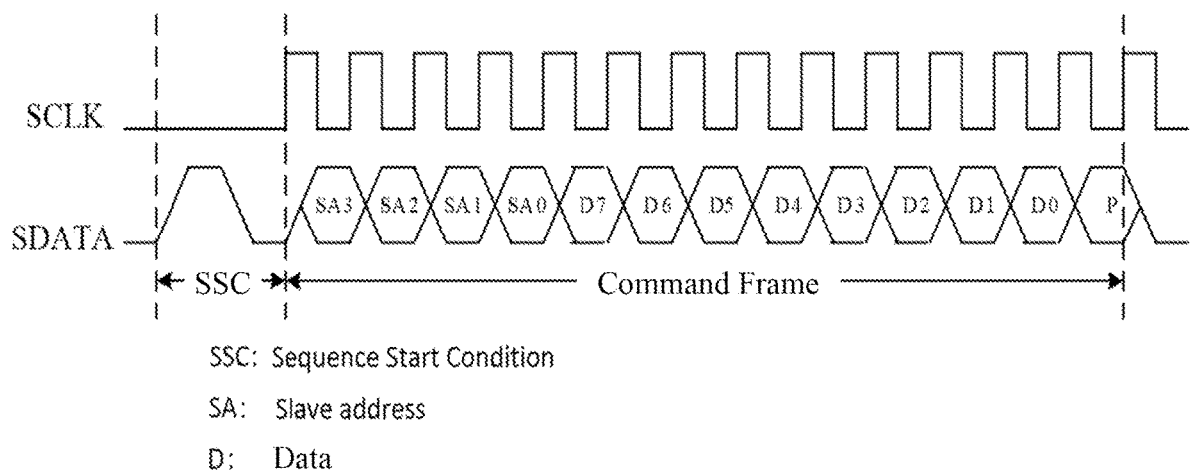
FIG. 1b shows waveform diagrams of signals transmitted on an SCLK and an SDATA in the related art.
Figure 1C:
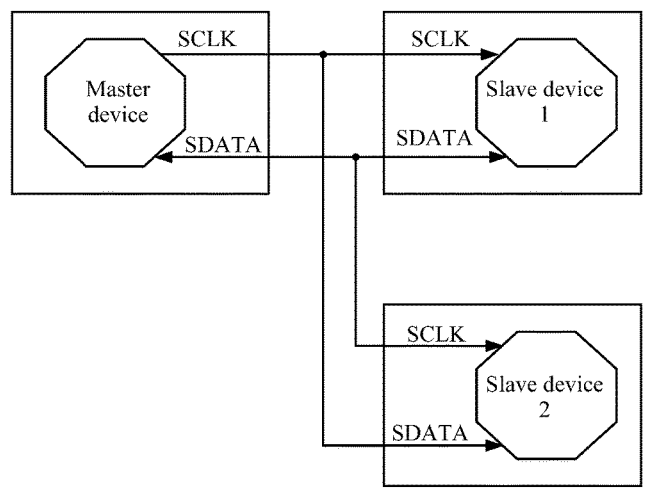
FIG. 1c is a schematic diagram of a mobile industry processor interface radio frequency front-end system for solving a bus conflict in the related art.

Typically, as shown in FIG. 1*b*, the data signal received by the mobile industry processor interface radio frequency front-end slave device and sent by the mobile industry processor interface radio frequency front-end master device may be: a 13-bit command frame, where bits 0 to 3 of the command frame is a slave address, bits 4 to 11 of the command frame is an RFFE command, and bit 12 of the command frame is a parity bit.

Correspondingly, the acquisition circuit in the data signal detection device 310 is configured to verify whether at least one of the following meets the characteristic of the data signal: verifying whether the parity bit in the command frame matches a binary adding result of first 12 bits of data in the command frame; verifying whether the RFFE command in the command frame matches a pre-stored standard RFFE command; or verifying whether the slave address in the command frame matches a pre-stored standard slave address; where different acquisition circuits pre-store different standard slave addresses.

Based on the above embodiments, the data signal processing unit may include: a data frame processing unit and state machine, and a file register.

The data frame processing unit and state machine is configured to receive the RFFE command in the command frame and process the RFFE command; and the file register is configured to receive the slave address in the command frame and process the received slave address.

Figure 3B:
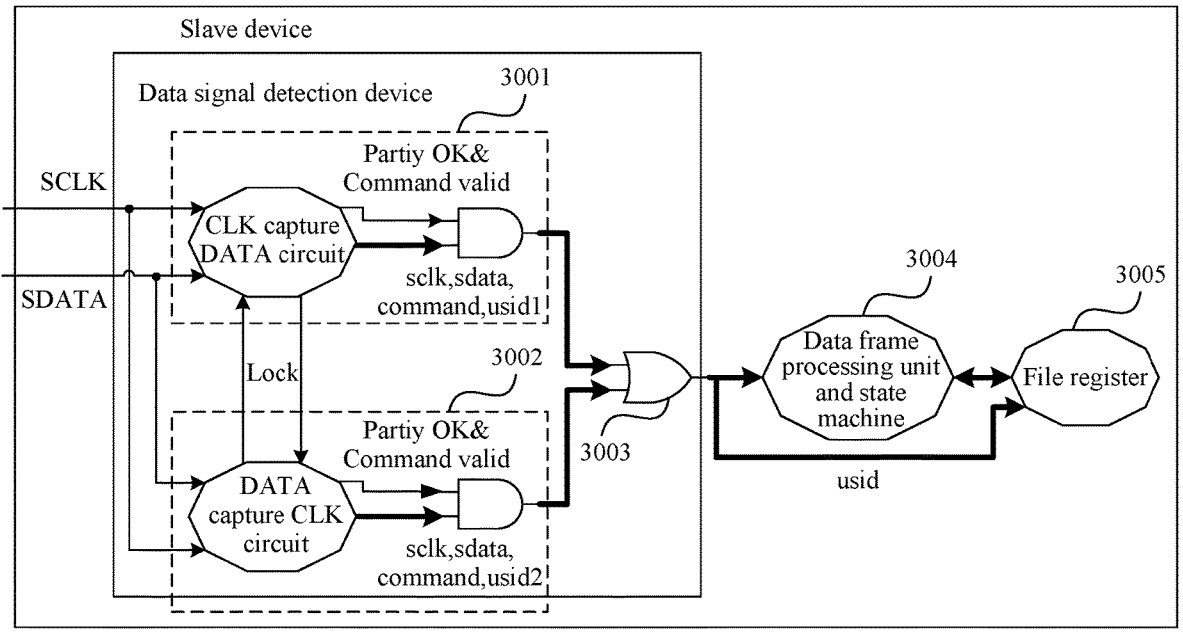
FIG. 3b is a schematic diagram illustrating a detailed structure of a mobile industry processor interface radio frequency front-end slave device according to embodiment 2 of the present disclosure.

FIG. 3b is a schematic diagram illustrating a specific structure of a mobile industry processor interface radio frequency front-end slave device according to embodiment 2 of the present disclosure. As shown in FIG. 3b, each acquisition circuit in the data signal detection device includes a capture circuit. The first terminal of the first acquisition circuit 3001 is connected to the SCLK terminal (the first device input terminal) of the mobile industry processor interface radio frequency front-end slave device, the second terminal of the first acquisition circuit 3001 is connected to the SDATA terminal (the second device input terminal) of the mobile industry processor interface radio frequency front-end slave device, and a CLK capture DATA circuit and an AND gate device are configured in the first acquisition circuit 3001. The first terminal of the second acquisition circuit 3002 is connected to the SDATA terminal (the second device input terminal) of the mobile industry processor interface radio frequency front-end slave device, the second terminal of the second acquisition circuit 3002 is connected to the SCLK terminal (the first device input terminal) of the mobile industry processor interface radio frequency front-end slave device, and a DATA capture CLK circuit and an AND gate device are configured in the second acquisition circuit 3002. Usid1 is pre-configured in the first acquisition circuit 3001 and usid2 is pre-configured in the second acquisition circuit 2002. The CLK capture DATA circuit and the DATA capture CLK circuit have the same structure, except that the signals used as the clock and the data are opposite.

In some embodiments, the CLK capture DATA circuit uses the signal received by the SCLK terminal of the mobile industry processor interface radio frequency front-end slave device as a clock to acquire the signal received by the SDATA terminal, and uses usid1 to match the slave address (SA) in the acquisition signal; and the DATA capture CLK circuit uses the signal received by the DATA terminal of the mobile industry processor interface radio frequency front-end slave device as a clock to acquire the signal received by the CLK terminal, and uses usid2 to match the SA in the acquisition signal.

In some embodiments, PartiyOK&Commandvalid includes an AND operation of two states, that is, whether the parity bit in the acquisition signal is accurate (PartiyOK), and whether the RFFE command in the acquisition signal matches the pre-stored standard RFFE command (Commandvalid). If both states are yes, it may be determined that the acquisition signal is a data signal, and correspondingly, PartiyOK&Commandvalid is a high level.

In fact, both the SCLK and the SDATA sent by the mobile industry processor interface radio frequency front-end master device are determined. Therefore, merely one of the two acquisition circuits (i.e., the first acquisition circuit 3001 and the second acquisition circuit 3002) will output a high level of PartiyOK&Commandvalid. At this time, it can be determined that the acquisition circuit that outputs PartiyOK&Commandvalid at a high level outputs valid SCLK and SDATA; at the same time, such acquisition circuit sends out a lock signal and locks the other incorrect acquisition circuit to make the other acquisition circuit no longer work.

In addition, since the two acquisition circuits each will output SCLK, SDATA, RFFE command and usidx (x=1 or 2) signals acquired by themselves, and after these signals are separately subjected to an AND operation with PartiyOK&Commandvalid, merely one AND gate of the two AND gates in FIG. 3b outputs valid signals, and what the other AND gate outputs are all low level signals. Then the OR gate device 3003 is used to perform an OR operation on the output results of the two AND gates to output actual SCLK, SDATA, RFFE command and usid signals. Then, the SCLK, SDATA, and RFFE command signals may be sent to the data frame processing unit and state machine 3004, and the usid may be sent to the file register 3005, so that the mobile industry processor interface radio frequency front-end slave device determines the above usid as its own slave ID, and may perform a corresponding operation according to the RFFE command.

In an optional implementation mode of the embodiment, clock synchronization is performed on two clocks in the two acquisition circuits in the data signal detection device, a clock in the data frame processing unit and state machine and a clock in the file register. The advantage of this setting is to ensure the setup and hold time of the digital circuit.

Figure 3C:
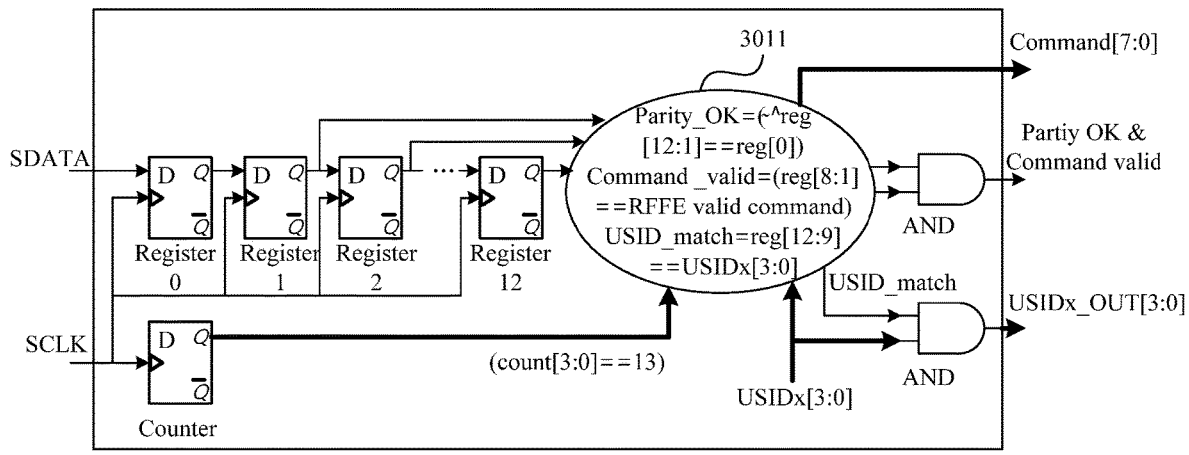
FIG. 3c is a schematic structural diagram of an acquisition circuit in a mobile industry processor interface radio frequency front-end slave device according to embodiment 2 of the present disclosure.

As mentioned above, when the data signal is a data frame with the set number of data bits (hereafter, a 13-bit command frame is taken as an example), the acquisition circuit includes: a shift register which matches the number of data bits of the data frame, a counter, a data signal determination unit, and an AND gate device. FIG. 3c is a schematic structural diagram of an acquisition circuit in a mobile industry processor interface radio frequency front-end slave device according to embodiment 2 of the present disclosure.

The command frame may be completely acquired through the shift register. When the counter counts to 13, it indicates that the command frame acquisition is finished. Each time of SSC resets the counter and the shift register. After the command frame acquisition is finished, whether the parity check is correct and whether the command is valid may be determined.

As shown in FIG. 3c, the data signal determination unit 3011 in the acquisition circuit determines three types of logic in total: whether the parity bit in the command frame matches a binary adding result of first 12 bits of data in the command frame (Parity OK=(~^reg[12:1]==reg[0], whether the data stored in register 0 is consistent with a negated value of the binary adding result of the data stored in register 12 to register 1, if yes, Parity OK is high, otherwise Parity OK is low); whether the RFFE command in the command frame matches a pre-stored standard RFFE command (Command valid=reg[8:1]==RFFE valid command, whether the data stored in register 8 to register 1 is a valid RFFE command, if yes, Command valid is high, otherwise, Command valid is low); and whether the slave address in the command frame matches a pre-stored standard slave address (USID_match=reg[12:9]==USIDx[3:0], whether the data stored in register 12 to register 9 is consistent with the data stored in USIDx[3:0], if yes, USID_match is high, otherwise, USID_match is low).

Correspondingly, through two AND gate devices, the PartiyOK&Commandvalid signal, the RFFE command and the usidx signal can be obtained separately.

The mobile industry processor interface radio frequency front-end slave device constructed by the above data signal detection device fully considers various abnormal conditions, and then can accurately and reliably determine the data signal from received two-channel signals and feed back the corresponding usidx signal, so the mobile industry processor interface radio frequency front-end slave device can use the usidx signal as its own slave address.

Embodiment 3

Figure 4:
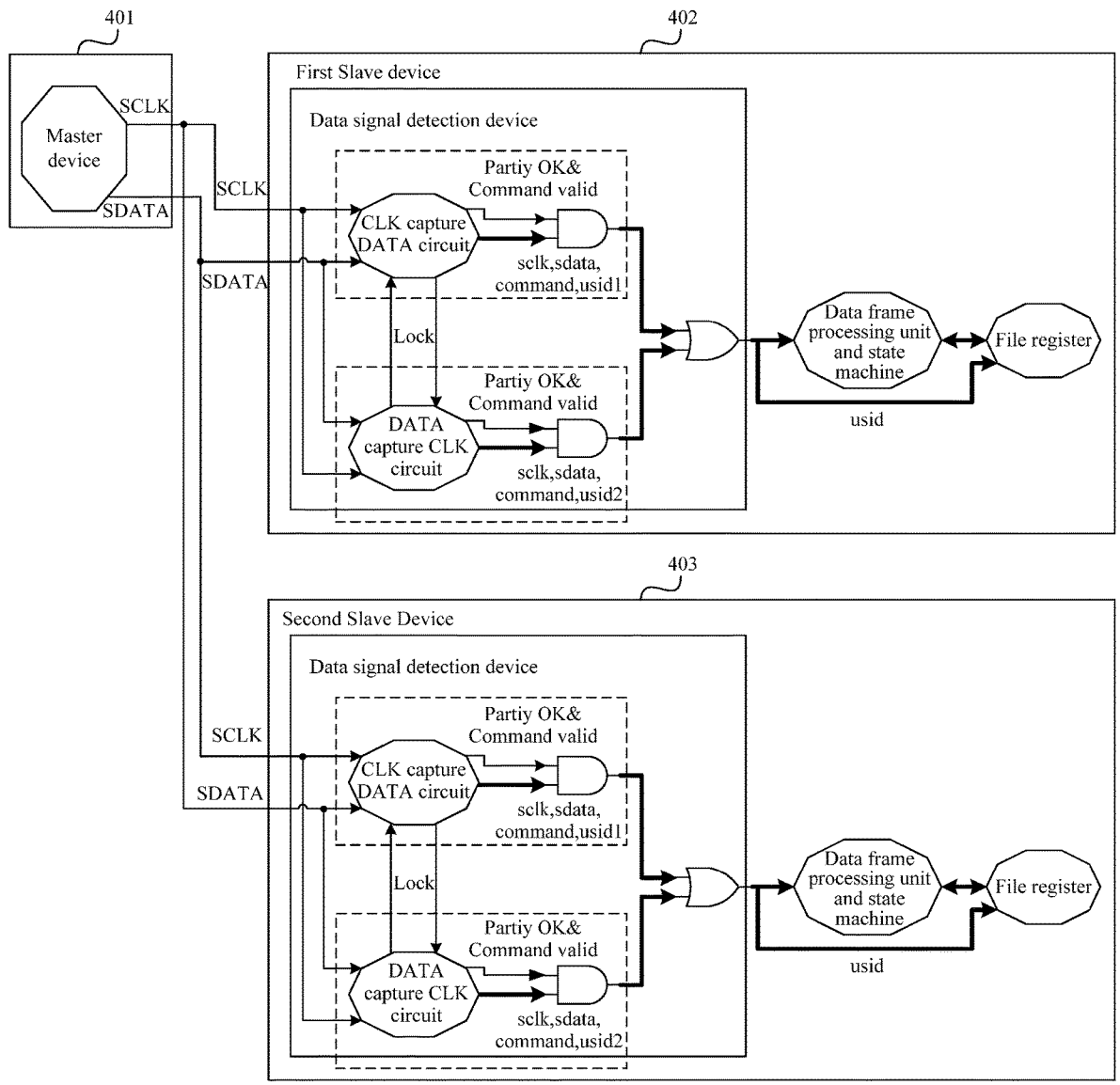
FIG. 4 is a schematic structural diagram of a mobile industry processor interface radio frequency front-end system according to embodiment 3 of the present disclosure.

FIG. 4 is a schematic structural diagram of a mobile industry processor interface radio frequency front-end system according to embodiment 3 of the present disclosure. The mobile industry processor interface radio frequency front-end system includes: a mobile industry processor interface radio frequency front-end master device 401 and two mobile industry processor interface radio frequency front-end slave devices (i.e., a first mobile industry processor interface radio frequency front-end slave device 402 and a second mobile industry processor interface radio frequency front-end slave device 403 in FIG. 4) of any embodiment described in the present disclosure; where the first mobile industry processor interface radio frequency front-end slave device 402 (i.e., the first MIPI RFFE slave device) and the second mobile industry processor interface radio frequency front-end slave device 403 (i.e., the second MIPI RFFE slave device) are two identical devices manufactured by the same manufacturer (having the same USID, the same PID, and the same MfrIID).

A clock terminal (SCLK) of the mobile industry processor interface radio frequency front-end master device 401 is separately connected to a first device input terminal (SCLK) of the first mobile industry processor interface radio frequency front-end slave device and a second device input terminal (SDATA) of the second mobile industry processor interface radio frequency front-end slave device 403; a data terminal (SDATA) of the mobile industry processor interface radio frequency front-end master device 401 is separately connected to a second device input terminal (SDATA) of the first mobile industry processor interface radio frequency front-end slave device 402 and a first device input terminal (SCLK) of the second mobile industry processor interface radio frequency front-end slave device 403.

Through the above configuration, the problem of a bus conflict between two same mobile industry processor interface radio frequency front-end slave devices in the mobile industry processor interface radio frequency front-end system can be accurately and reliably solved.

In the embodiments of the present disclosure, a data signal detection device is constructed by using two acquisition circuits having the same circuit structure and the selection output circuit, and two input terminals of one of the two acquisition circuits are cross-connected to two input terminals of the other one of the two acquisition circuits, so that it is possible to implement that when one of the two input signals input to the data signal detection device is a clock signal and the other one of the two input signals input to the data signal detection device is a data signal, the two acquisition circuits each use the signal received by the first input terminal as a clock to acquire the signal received by the second input terminal, verify whether the acquisition signal meets the characteristic of the data signal, and then output the corresponding signal to the selection output circuit according to the verification result, which can achieve the effect that the selection output circuit can accurately output the data signal no matter how the two input signals input to the data signal detection device are connected to the above two acquisition circuits. After a slave device is correspondingly constructed based on the above-mentioned data signal detection device, the constructed slave device fully considers various abnormal conditions, and then can accurately and reliably solve the problem of a bus conflict between two same slave devices in the mobile industry processor interface radio frequency front-end system.

What is claimed is:
1. A data signal detection device, comprising: two acquisition circuits having a same circuit structure, and a selection output circuit, wherein the two acquisition circuits are a first acquisition circuit and a second acquisition circuit respectively;
wherein, a first input terminal of the first acquisition circuit is connected to a second input terminal of the second acquisition circuit, and a second input terminal of the first acquisition circuit is connected to a first input terminal of the second acquisition circuit; output terminals of the two acquisition circuits are respectively connected to two input terminals of the selection output circuit;
wherein the first acquisition circuit is configured to: use a signal received by the first input terminal of the first acquisition circuit as a clock signal to acquire a signal received by the second input terminal of the first acquisition circuit, verify whether an acquisition signal acquired by the first acquisition circuit meets a characteristic of a data signal, output the acquisition signal acquired by the first acquisition circuit to the selection output circuit based on a verification result that the acquisition signal acquired by the first acquisition circuit meets the characteristic of the data signal, and output a set invalid signal to the selection output circuit based on a verification result that the acquisition signal acquired by the first acquisition circuit does not meet the characteristic of the data signal;
wherein the second acquisition circuit is configured to: use a signal received by the first input terminal of the second acquisition circuit as a clock signal to acquire a signal received by the second input terminal of the second acquisition circuit, verify whether an acquisition signal acquired by the second acquisition circuit meets the characteristic of the data signal, output the acquisition signal acquired by the second acquisition circuit to the selection output circuit based on a verification result that the acquisition signal acquired by the second acquisition circuit meets the characteristic of the data signal, and output the invalid signal to the selection output circuit based on a verification result that the acquisition signal acquired by the second acquisition circuit does not meet the characteristic of the data signal; and wherein the selection output circuit is configured to select, from the received acquisition signal and the received invalid signal, the received acquisition signal to output as the data signal.

2. The data signal detection device of claim 1, wherein the invalid signal comprises signals which are all at low level; and
the selection output circuit is an OR gate device, and the OR gate device is configured to output the acquisition signal when the acquisition signal and the signals which are all at low level are input.

3. The data signal detection device of claim 1, wherein the data signal comprises: a data frame having a set number of data bits;
each of the two acquisition circuits comprises: a shift register which matches the number of data bits of the data frame, a counter, a data signal processor, and an AND gate device;
in the each of the two acquisition circuits:
a clock input terminal of the shift register is the first input terminal of the acquisition circuit, a signal input terminal of the shift register is the second input terminal of the acquisition circuit, an output terminal of each register of the shift register is separately connected to an input terminal of the data signal processor, an input terminal of the counter is connected to the clock input terminal of the shift register, an output terminal of the counter is connected to an input terminal of the data signal processor, an acquisition signal output terminal and a valid determination bit output terminal of the data signal processor are respectively connected to two input terminals of the AND gate device, and an output terminal of the AND gate device is the output terminal of the acquisition circuit;

the shift register is configured to acquire an acquisition signal which matches the number of data bits of the data frame, and send the acquisition signal acquired by the shift register to the unit data signal processor;

the counter is configured to send indication information to the data signal processor when the counter counts to the number of data bits of the data frame;

the data signal processor is configured to: when receiving the indication information, combine data stored in respective registers of the shift register into the acquisition signal acquired by the shift register, output the acquisition signal acquired by the shift register to the acquisition signal output terminal, verify whether the acquisition signal meets the characteristic of the data signal, generate a valid determination bit corresponding to a verification result of verifying whether the acquired signal meets the characteristic of the data signal, and output the valid determination bit to the valid determination bit output terminal; and the AND gate device is configured to output a result of performing an AND operation on the valid determination bit and the acquisition signal acquired by the shift register.

4. The data signal detection device of claim 3, wherein the each of the two acquisition circuits further comprises: a locking circuit; and the locking circuit is separately connected to the valid determination bit output terminal of the acquisition circuit and another acquisition circuit; the locking circuit is configured to make the another acquisition circuit no longer work when the valid determination bit output terminal of the acquisition circuit outputs a valid signal.

5. The data signal detection device of claim 4, wherein the locking circuit is implemented by at least one of a flip-flop or a latch.

6. A mobile industry processor interface radio frequency front-end (RFFE) slave device, comprising: a data signal detection device, a first device input terminal, a second device input terminal and a data signal processing unit;

wherein the data signal detection device comprises: two acquisition circuits having a same circuit structure, and a selection output circuit, wherein the two acquisition circuits are a first acquisition circuit and a second acquisition circuit respectively;

wherein, a first input terminal of the first acquisition circuit is connected to a second input terminal of the second acquisition circuit, and a second input terminal of the first acquisition circuit is connected to a first input terminal of the second acquisition circuit; output terminals of the two acquisition circuits are respectively connected to two input terminals of the selection output circuit;

wherein the first acquisition circuit is configured to: use a signal received by the first input terminal of the first acquisition circuit as a clock signal to acquire a signal received by the second input terminal of the first acquisition circuit, verify whether an acquisition signal acquired by the first acquisition circuit meets a characteristic of a data signal, output the acquisition signal acquired by the first acquisition circuit to the selection output circuit based on a verification result that the acquisition signal acquired by the first acquisition circuit meets the characteristic of the data signal, and output a set invalid signal to the selection output circuit based on a verification result that the acquisition signal acquired by the first acquisition circuit does not meet the characteristic of the data signal;

wherein the second acquisition circuit is configured to: use a signal received by the first input terminal of the second acquisition circuit as a clock signal to acquire a signal received by the second input terminal of the second acquisition circuit, verify whether an acquisition signal acquired by the second acquisition circuit meets the characteristic of the data signal, output the acquisition signal acquired by the second acquisition circuit to the selection output circuit based on a verification result that the acquisition signal acquired by the second acquisition circuit meets the characteristic of the data signal, and output the invalid signal to the selection output circuit based on a verification result that the acquisition signal acquired by the second acquisition circuit does not meet the characteristic of the data signal; and wherein the selection output circuit is configured to select, from the received acquisition signal and the received invalid signal, the received acquisition signal to output as the data signal;

wherein the first device input terminal is connected to a first input terminal of a target acquisition circuit in the data signal detection device, and the target acquisition circuit is one of the two acquisition circuits in the data signal detection device; the second device input terminal is connected to a second input terminal of the target acquisition circuit; the data signal processing unit is connected to the selection output circuit in the data signal detection device;

one of the first device input terminal and the second device input terminal is configured to receive a clock signal which is used to be input into the target acquisition circuit, and another one of the first device input terminal and the second device input terminal is configured to receive a data signal which is used to be input into the target acquisition circuit;

the data signal detection device is configured to select a correct data signal among signals input from the first device input terminal and the second device input terminal and send the correct data signal to the data signal processing unit; and the data signal processing unit is configured to process the received data signal.

7. The mobile industry processor interface RFFE slave device of claim 6, wherein the data signal is: a 13-bit command frame, wherein bits 0 to 3 of the command frame are a slave address, bits 4 to 11 of the command frame are an RFFE command, and bit 12 of the command frame is a parity bit;

the acquisition circuit in the data signal detection device is configured to verify whether at least one of following meets the characteristic of the data signal:

verifying whether the parity bit in the command frame matches a binary adding result of first 12 bits of data in the command frame;

verifying whether the RFFE command in the command frame matches a pre-stored standard RFFE command; and verifying whether the slave address in the command frame matches a pre-stored standard slave address;

wherein different acquisition circuits pre-store different standard slave addresses.

8. The mobile industry processor interface RFFE slave device of claim 7, wherein the data signal processing unit comprises: a data frame processing unit and state machine and a file register;

the data frame processing unit and state machine is configured to receive the RFFE command in the command frame and process the RFFE command; and the file register is configured to receive the slave address in the command frame and process the received slave address.

9. The mobile industry processor interface RFFE slave device of claim 8, wherein clock synchronization is performed on two clocks in the two acquisition circuits in the data signal detection device, a clock in the data frame processing unit and state machine and a clock in the file register.

10. A mobile industry processor interface radio frequency front-end system, comprising: a mobile industry processor interface radio frequency front-end master device and two mobile industry processor interface radio frequency front-end slave devices; wherein the two mobile industry processor interface radio frequency front-end slave devices are the same, and the two slave devices are respectively a first mobile industry processor interface radio frequency front-end slave device and a second mobile industry processor interface radio frequency front-end slave device;

wherein each of the two mobile industry processor interface radio frequency front-end slave devices comprises a data signal detection device, a first device input terminal, a second device input terminal and a data signal processing unit;

wherein the data signal detection device comprises: two acquisition circuits having a same circuit structure, and a selection output circuit, wherein the two acquisition circuits are a first acquisition circuit and a second acquisition circuit respectively;

wherein, a first input terminal of the first acquisition circuit is connected to a second input terminal of the second acquisition circuit, and a second input terminal of the first acquisition circuit is connected to a first input terminal of the second acquisition circuit; output terminals of the two acquisition circuits are respectively connected to two input terminals of the selection output circuit;

wherein the first acquisition circuit is configured to: use a signal received by the first input terminal of the first acquisition circuit as a clock signal to acquire a signal received by the second input terminal of the first acquisition circuit, verify whether an acquisition signal acquired by the first acquisition circuit meets a characteristic of a data signal, output the acquisition signal acquired by the first acquisition circuit to the selection output circuit based on a verification result that the acquisition signal acquired by the first acquisition circuit meets the characteristic of the data signal, and output a set invalid signal to the selection output circuit based on a verification result that the acquisition signal acquired by the first acquisition circuit does not meet the characteristic of the data signal;

wherein the second acquisition circuit is configured to: use a signal received by the first input terminal of the second acquisition circuit as a clock signal to acquire a signal received by the second input terminal of the second acquisition circuit, verify whether an acquisition signal acquired by the second acquisition circuit meets the characteristic of the data signal, output the acquisition signal acquired by the second acquisition circuit to the selection output circuit based on a verification result that the acquisition signal acquired by the second acquisition circuit meets the characteristic of the data signal, and output the invalid signal to the selection output circuit based on a verification result that the acquisition signal acquired by the second acquisition circuit does not meet the characteristic of the data signal; and wherein the selection output circuit is configured to select, from the received acquisition signal and the received invalid signal, the received acquisition signal to output as the data signal;

wherein the first device input terminal is connected to a first input terminal of a target acquisition circuit in the data signal detection device, and the target acquisition circuit is one of the two acquisition circuits in the data signal detection device; the second device input terminal is connected to a second input terminal of the target acquisition circuit; the data signal processing unit is connected to the selection output circuit in the data signal detection device;

one of the first device input terminal and the second device input terminal is configured to receive a clock signal which is used to be input into the target acquisition circuit, and another one of the first device input terminal and the second device input terminal is configured to receive a data signal which is used to be input into the target acquisition circuit;

the data signal detection device is configured to select a correct data signal among signals input from the first device input terminal and the second device input terminal and send the correct data signal to the data signal processing unit; and the data signal processing unit is configured to process the received data signal;

wherein a clock terminal of the mobile industry processor interface radio frequency front-end master device is separately connected to the first device input terminal of the first mobile industry processor interface radio frequency front-end slave device and the second device input terminal of the second mobile industry processor interface radio frequency front-end slave device; a data terminal of the mobile industry processor interface radio frequency front-end master device is separately connected to the second device input terminal of the first mobile industry processor interface radio frequency front-end slave device and the first device input terminal of the second mobile industry processor interface radio frequency front-end slave device.

11. The mobile industry processor interface radio frequency front-end system of claim 10, wherein the data signal is: a 13-bit command frame, wherein bits 0 to 3 of the command frame are a slave address, bits 4 to 11 of the command frame are an RFFE command, and bit 12 of the command frame is a parity bit;

the acquisition circuit in the data signal detection device is configured to verify whether at least one of following meets the characteristic of the data signal;

verifying whether the parity bit in the command frame matches a binary adding result of first 12 bits of data in the command frame;

verifying whether the RFFE command in the command frame matches a pre-stored standard RFFE command; and verifying whether the slave address in the command frame matches a pre-stored standard slave address;

wherein different acquisition circuits pre-store different standard slave addresses.

12. The mobile industry processor interface radio frequency front-end system of claim 11, wherein the data signal processing unit comprises: a data frame processing unit and state machine and a file register;

the data frame processing unit and state machine is configured to receive the RFFE command in the command frame and process the RFFE command; and the file register is configured to receive the slave address in the command frame and process the received slave address.

13. The mobile industry processor interface radio frequency front-end system of claim 12, wherein clock synchronization is performed on two clocks in the two acquisition circuits in the data signal detection device, a clock in the data frame processing unit and state machine and a clock in the file register.

* * * * *